(12) United States Patent
Lamarche et al.

(10) Patent No.: US 8,962,988 B2
(45) Date of Patent: Feb. 24, 2015

(54) INTEGRATED SEMICONDUCTOR SOLAR CELL PACKAGE

(75) Inventors: Paul F. Lamarche, Morgan Hill, CA (US); Kyle Jeffrey Russo Tripp, San Francisco, CA (US)

(73) Assignee: Solar Junction Corporation, San Jose, CA (US)

( * ) Notice: Subject to any disclaimer, the term of this patent is extended or adjusted under 35 U.S.C. 154(b) by 456 days.

(21) Appl. No.: 13/224,181

(22) Filed: Sep. 1, 2011

(65) Prior Publication Data

US 2012/0199194 A1      Aug. 9, 2012

Related U.S. Application Data

(60) Provisional application No. 61/439,082, filed on Feb. 3, 2011, provisional application No. 61/439,095, filed on Feb. 3, 2011.

(51) Int. Cl.
*H01L 31/02* (2006.01)
*H01L 31/052* (2014.01)

(52) U.S. Cl.
CPC .......... *H01L 31/02008* (2013.01); *Y02E 10/50* (2013.01); *H01L 31/052* (2013.01)
USPC .......................................... 136/259; 136/246

(58) Field of Classification Search
CPC .......................... H01L 31/0486; H01L 31/024
See application file for complete search history.

(56) References Cited

U.S. PATENT DOCUMENTS

| | | | |
|---|---|---|---|
| 4,180,414 A * | 12/1979 | Diamond et al. | 136/246 |
| 4,830,678 A | 5/1989 | Todorof et al. | |
| 4,834,805 A | 5/1989 | Erbert | |
| 4,999,060 A | 3/1991 | Szekely et al. | |
| 5,118,361 A | 6/1992 | Fraas et al. | |
| 5,460,659 A | 10/1995 | Krut | |
| 5,500,052 A | 3/1996 | Horiuchi et al. | |
| 5,935,345 A | 8/1999 | Kuznicki | |
| 5,944,913 A | 8/1999 | Hou et al. | |

(Continued)

FOREIGN PATENT DOCUMENTS

| | | |
|---|---|---|
| EP | 2254156 A2 | 11/2010 |
| WO | 2011/137305 | 11/2011 |

(Continued)

OTHER PUBLICATIONS

International Search Report and Written Opinion of the International Searching Authority for PCT Application No. PCT/US2012/022539, mailed on May 23, 2012, 10 pages.

(Continued)

*Primary Examiner* — Jennifer Michener
*Assistant Examiner* — Christopher Danicic
(74) *Attorney, Agent, or Firm* — William R. Lambert; Kenneth Allen; Kilpatrick Townsend & Stockton LLP

(57) ABSTRACT

A device containing a solar cell is provided in the form of a stacked package that has a planar arrangement of conductive laminates at or below the surface of a heat sink. The planar alignment allows placement of electrical connections below the surface of the heat sink and reduces the vertical profile of the device, making it easier to be hermetically sealed. In specific embodiments the solar cell substrate is embedded within the heat sink during the manufacturing phase, eliminating the need for a thermally conductive substrate between the solar cell and the heat sink.

18 Claims, 10 Drawing Sheets

(56) References Cited

U.S. PATENT DOCUMENTS

| | | | |
|---|---|---|---|
| 6,281,426 | B1 | 8/2001 | Olson et al. |
| 6,623,283 | B1 | 9/2003 | Torigian et al. |
| 7,449,630 | B2 | 11/2008 | Ho et al. |
| 7,514,782 | B2 | 4/2009 | Hiramatsu et al. |
| 7,727,795 | B2 | 6/2010 | Stan et al. |
| 7,851,693 | B2 | 12/2010 | Fork et al. |
| 2003/0029497 | A1 | 2/2003 | Tanaka |
| 2004/0119149 | A1 | 6/2004 | Yin Pang et al. |
| 2005/0155641 | A1 | 7/2005 | Fafard |
| 2006/0162768 | A1 | 7/2006 | Wanlass et al. |
| 2006/0163596 | A1 | 7/2006 | Kim et al. |
| 2006/0185716 | A1 | 8/2006 | Murozono et al. |
| 2006/0240599 | A1 | 10/2006 | Amano et al. |
| 2007/0089774 | A1 | 4/2007 | Lasich |
| 2007/0090517 | A1 | 4/2007 | Moon et al. |
| 2007/0241450 | A1 | 10/2007 | Hiramatsu et al. |
| 2007/0290287 | A1 | 12/2007 | Freedman |
| 2008/0150064 | A1 | 6/2008 | Zimmerman et al. |
| 2008/0185040 | A1 | 8/2008 | Tom et al. |
| 2008/0190480 | A1 | 8/2008 | Joshi |
| 2008/0230110 | A1 | 9/2008 | Freedman |
| 2008/0315398 | A1 | 12/2008 | Lo et al. |
| 2009/0064994 | A1 | 3/2009 | Weatherby et al. |
| 2009/0086478 | A1 | 4/2009 | Sanroma et al. |
| 2009/0120500 | A1 | 5/2009 | Prather et al. |
| 2009/0159126 | A1 | 6/2009 | Chan |
| 2009/0229659 | A1 | 9/2009 | Wanlass et al. |
| 2009/0255575 | A1 | 10/2009 | Tischler |
| 2009/0266395 | A1* | 10/2009 | Murthy et al. ............ 136/206 |
| 2009/0272438 | A1 | 11/2009 | Cornfeld |
| 2010/0037935 | A1 | 2/2010 | Viad et al. |
| 2010/0051085 | A1* | 3/2010 | Weidman et al. ............ 136/244 |
| 2010/0132765 | A1 | 6/2010 | Cumpston et al. |
| 2010/0139752 | A1 | 6/2010 | Fang |
| 2010/0180936 | A1 | 7/2010 | Kim |
| 2010/0294362 | A1 | 11/2010 | Christ et al. |
| 2010/0313954 | A1 | 12/2010 | Seel et al. |
| 2010/0326429 | A1 | 12/2010 | Cumpston et al. |
| 2010/0326492 | A1 | 12/2010 | Tan et al. |
| 2011/0030764 | A1* | 2/2011 | Seo et al. ............ 136/246 |
| 2011/0265871 | A1 | 11/2011 | Lamarche |
| 2012/0199194 | A1 | 8/2012 | Lamarche et al. |
| 2012/0199195 | A1 | 8/2012 | Lamarche |
| 2012/0199196 | A1 | 8/2012 | Lamarche |

FOREIGN PATENT DOCUMENTS

| | | |
|---|---|---|
| WO | 2012/106160 | 8/2012 |
| WO | 2012/106165 | 8/2012 |

OTHER PUBLICATIONS

International Search Report and Written Opinion of the International Searching Authority for PCT Application No. PCT/US2012/022611, mailed on Jun. 21, 2012, 9 pages.
International Search Report and Written Opinion corresponding to the PCT application No. PCT/US2011/034485, date of mailing Aug. 3, 2011, 9 pages total.
Non-Final Office Action mailed on Dec. 19, 2012, for U.S. Appl. No. 13/224,204, 14 pages.
Non-Final Office Action mailed on Mar. 14, 2013, for U.S. Appl. No. 13/092,555, 12 pages.
Non-Final Office Action mailed on Nov. 21, 2013, for U.S. Appl. No. 12/944,361, 11 pages.
Non-Final Office Action mailed on Dec. 11, 2013, for U.S. Appl. No. 13/092,555, 12 pages.
Non-Final Office Action mailed on Mar. 14, 2013, for U.S. Appl. No. 13/224,232, 16 pages.
Non-Final Office Action mailed on Aug. 1, 2013, for U.S. Appl. No. 13/224,204, 15 pages.
Non-Final Office Action mailed on Dec. 17, 2013, for U.S. Appl. No. 13/224,232, 19 pages.
International Search Report and Written Opinion corresponding to PCT Application No. PCT/US2011/034485, mailed on Aug. 3, 2011, 9 pages.
International Preliminary Report on Patentability corresponding to the PCT Application No. PCT/US2011/034485, mailed on Nov. 15, 2012, 7 pages.
International Search Report and Written Opinion corresponding to PCT Application No. PCT/US2011/036486, mailed on Aug. 25, 2011, 12 pages.
International Search Report and Written Opinion corresponding to PCT Application No. PCT/US2010/056800, mailed on Jan. 26, 2011, 8 pages.
Cotal et al., "III-V multijunction solar cells for concentrating photovoltaics", Energy and Environment Science, Dec. 10, 2008, pp. 174-192.
Friedman et al., "Breakeven Criteria for the GaInNAs Junction in GaInP/GaAs/GaInNAs/Ge Four-junction Solar Cells", Progress in Photovoltaics: Research and Applications, 2002, pp. 331-344.
Garcia et al., "Analysis of Tellurium as N-Type Dopant in GaInP: Doping, Diffustion, Memory Effect and Surfactant Properties", Journal of Crystal Growth 298 2007, pp. 794-799.
Geelen et al., "Epitaxial Lift-Off GaAs Solar Cell From a Reusable GaAs Substrate", Materials Science and Engineering B45, 1997, pp. 162-171.
Green, "Do Built-in Fields Improve Solar Cell Performance?", Progress in Photovoltaics: Research and Applications, 2009, pp. 57-66.
Jackrel et al., "Dilute nitride GaInNAs and GaInNAsSb solar cells by molecular beam epitaxy", Journal of Applied Physics 101, 114916, 2007, pp. 1-8.
Janotti et. al., "Mutual Passivation of Electrically Active and Isovalent Impurities in Dilute Nitrides", Physical Review Letters 100, 2008, 045505.
Ng et al., "1EV GANXAS1-X-YSBY Material for Lattice-Matched III-V Solar Cell Implementation on GAAS and GE", Photovoltaic Specialists Conference (PVSC), 2009, 34$^{th}$ IEEE, pp. 76-80.
Ptak et al., "Low-acceptor-Concentration GaInNAs grown by Molecular-beam Epitaxy for High-current p-i-n solar cell applications", Journal of Applied Physics 98, 2005, 094501.
Volz et al., "Optimization of Annealing Conditions of (GaIn)(NAs) for Solar Cell Applications", Journal of Crystal Growth 310, 2008, pp. 2222-2228.
Wu et al., "Band Anticrossing in Highly Mismatched III-V Semiconductor Alloys", Semiconductor Science and Technology 17, 2002, pp. 860-869.
Yamaguchi et al., "Multi-junction III-V solar cells: Current status and future potential", Solar Energy, Jul. 2005, vol. 79, Issue 1, Abstract only.
Yu et. al., "Mutual Passivation of Group IV Donors and Nitrogen in Diluted GaNxAs1-x Alloys", Applied Physics Letters, vol. 83, No. 14, Oct. 6, 2003, pp. 2844-2846.

* cited by examiner

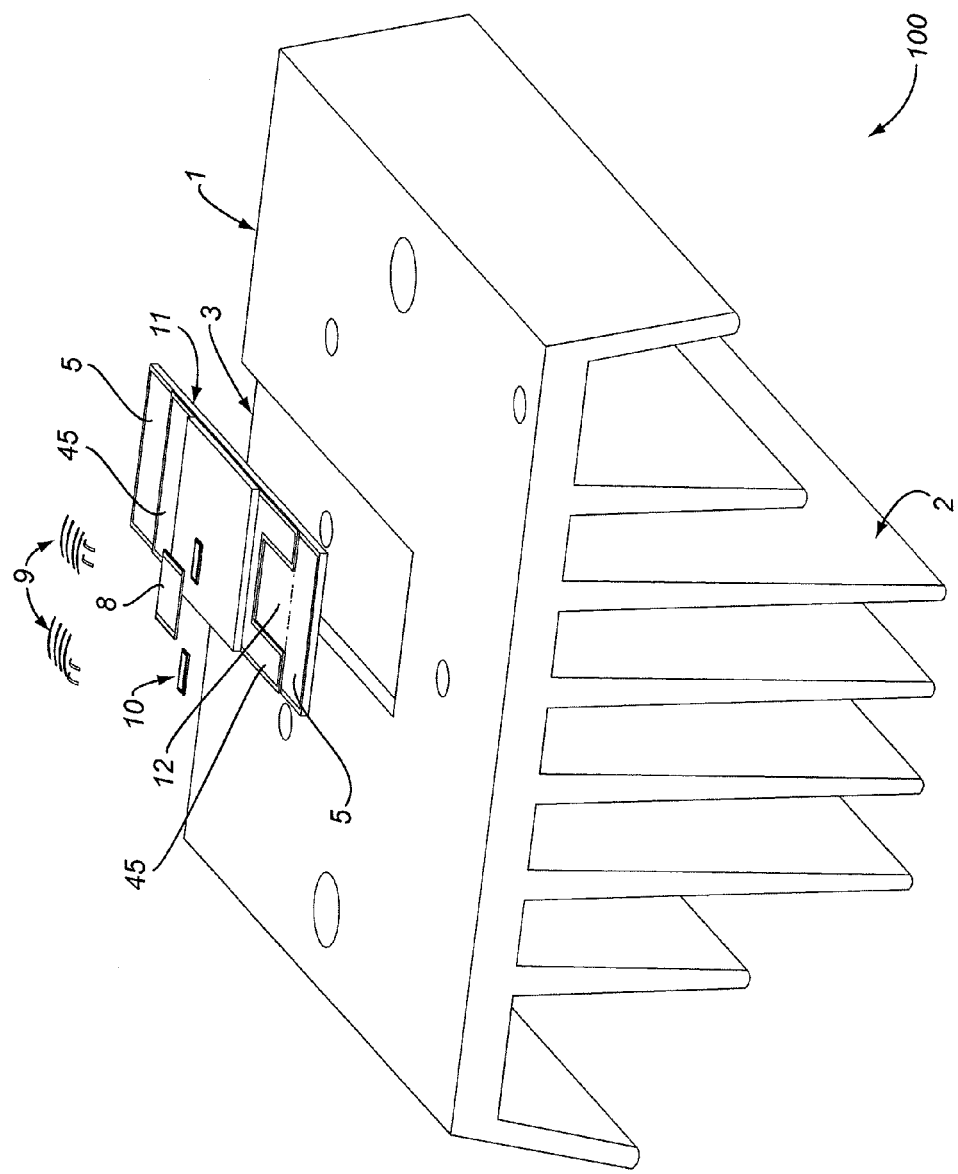

INTEGRATED SEMICONDUCTOR SOLAR CELL PACKAGE

CROSS-REFERENCES TO RELATED APPLICATIONS

This application was filed contemporaneously with U.S. Provisional Application No. 61/439,082, filed on Feb. 3, 2011, entitled "INTEGRATED SEMICONDUCTOR SOLAR CELL PACKAGE" and U.S. Provisional Patent Application No. 61/439,095, filed on Feb. 3, 2011, entitled "FLEXIBLE HERMETIC SEMICONDUCTOR SOLAR CELL PACKAGE WITH NON-HERMETIC OPTION," the contents of which are incorporated herein by reference in their entirety.

STATEMENT AS TO RIGHTS TO INVENTIONS MADE UNDER FEDERALLY SPONSORED RESEARCH AND DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

This invention relates to packaging for semiconductor photovoltaic devices and specifically for solar cells that are subject to solar-induced heating.

Photovoltaic devices present unique problems requiring specialized packaging to achieve desired levels of durability, mechanical integrity, electrical connectivity, maximum thermal transfer, and convenience of mounting. The devices comprising the packaging must also lend itself to a low cost and highly automated manufacturing process. The delicate semiconductor material used as the operative portion of a solar cell must be protected from excessive current by attaching, for example, an additional device such as a bypass diode in parallel with the anode and cathode of the device, an operation normally accomplished by soldering surface mount plastic packaged devices in a manner that may cause high rates of mechanical failure in actual usage. Further, suppliers of photovoltaic cells and systems are increasingly required to guarantee that their products will operate without replacement for long periods of time, in some cases up to 30 years or more. The packaging for such cells must therefore provide durability as well as reliability.

Current solar cell package designs suffer from design and component limitations that restrict package usage. For example, solar cell packaging to date has relied on ceramics such as aluminum nitride (ALN) and berylium oxide (BeO) to provide thermally conductive substrates between the heat sink and solar cell. Because of the limited number of suppliers, use of these ceramic substrates increases the cost of manufacturing the solar packaging. Commercialized solar packages also require that the chip, thermally conductive substrates, and heat sink be stacked vertically, increasing the profile of the package and thereby making hermetic sealing of the solar package more difficult and expensive. A further limitation of solar packaging designs in current use is a maximum platform size of 4.5 inches×4.5 inches. An increased platform size would reduce the raw materials input required at the front end of the manufacturing process, ultimately increasing the capacity throughput.

SUMMARY

According to the invention, a device containing a solar cell is provided in the form of a stacked package that has a planar arrangement of conductive laminates at or below the surface of a heat sink. The planar alignment allows placement of electrical connections below the surface of the heat sink and reduces the vertical profile of the device, making it easier to be hermetically sealed. In specific embodiments the solar cell substrate is embedded within the heat sink during the manufacturing phase, eliminating the need for a thermally conductive substrate between the solar cell and the heat sink. The durable and easily manufactured solar chip packages have lower vertical and narrower horizontal profiles than heretofore, presenting a more versatile package and a less expensive manufacturing alternative to current chip packaging technologies. Electrical connections are made between the chip and protective bypass diodes or other external circuitry without the need for complex, time consuming, expensive, and vulnerable plastic packaging and soldered interconnections.

Several embodiments are disclosed. In general. a stacked component solar cell package has a planar arrangement of conductive laminates at or below the surface of the heat sink. The stacked component package isolates the solar cell electrically from the heat sink, while the planar alignment allows more electrical connections below the surface of the heat sink, twice as many as other known solar packages. This layout also reduces the vertical profile of the solar package, allowing it to be more easily sealed (against moisture or hermetically) with the primary and secondary optics.

In a further embodiment, a stacked component solar cell package has one or more thermally-conductive laminates integrated with the heat sink. These conductive laminates comprise non-ceramic PCB-board type materials, allowing more efficient and cost-effective heat dissipation, and eliminate the need for a thermally conductive substrate layer (typically ALN or BeO) between the solar cell and the heat sink. These embodiments allow electrical connections to be made between the chip and a protective bypass diode or other external circuitry without the need for complex, time consuming, expensive, and vulnerable plastic packaged devices. Additionally the substrate can be embedded within the heat sink during the manufacturing phase, simplifying the assembly process and making assembly of the solar package faster, less expensive, and more easily scalable.

Packaging as described permits the use of standard photovoltaic semiconductor chips having an anode on one surface and a cathode on the opposing surface without need for expensive processing of the chip, extra masks or custom assembly equipment. Assembly of the solar cell components is simplified, both as to the package itself and later for sub-assembly and connectivity requirements. This also allows for scaling the manufacturing process to high volume output in a relatively short time. Additionally, the design allows the solar package to be downsized to ultimately reduce the size of commercial solar arrays.

Other benefits from the invention will become readily apparent to those of skill in the arts of semiconductor design and packaging from the following detailed description in connection with the accompanying drawings

BRIEF DESCRIPTION OF THE DRAWINGS

FIG. 9 an assembly view showing a multi-layered, substrate-embedded laminate embodiment of the invention.

DETAILED DESCRIPTION OF THE INVENTION

Substrate Insert Embodiments

Figure 1:
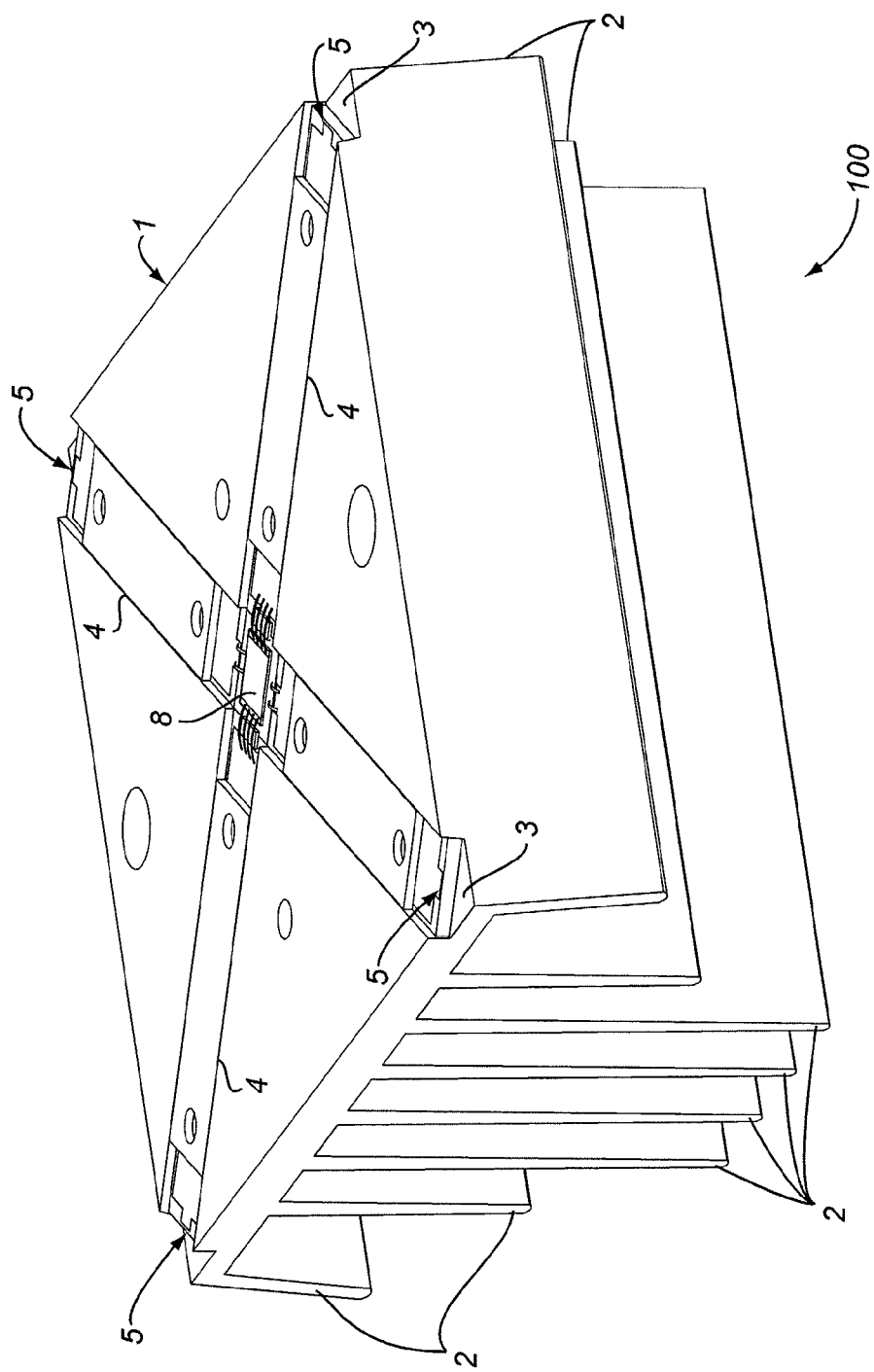
FIG. 1 is a plan view of a finished and packaged solar cell manufactured in accordance with a substrate-insert embodiment of the invention.
Figure 2:
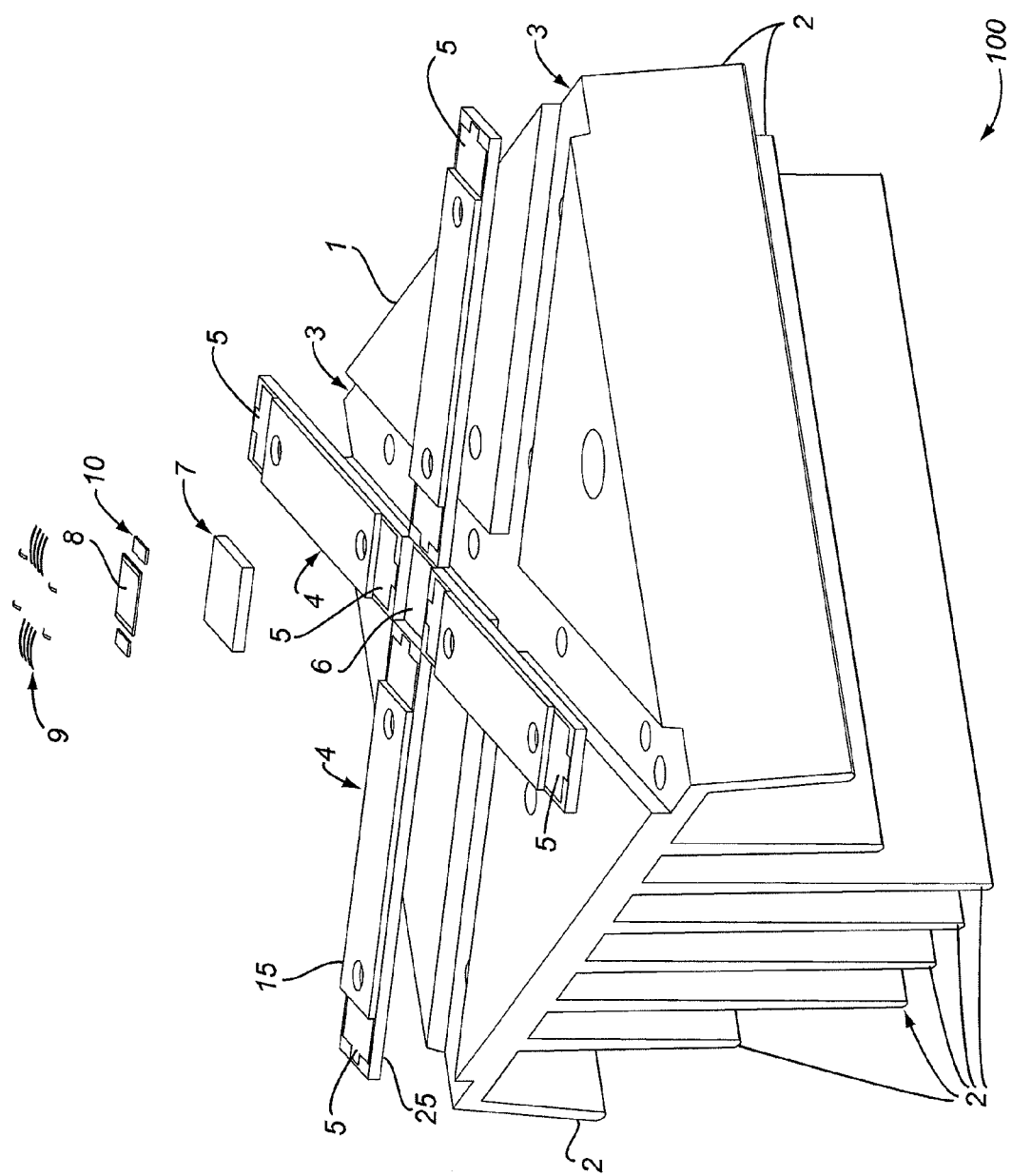
FIG. 2 is an assembly view of one substrate-insert embodiment.

FIG. 1 shows one embodiment of a solar cell device or package 100 assembled from the various stackable components as shown in FIG. 2. The solar cell package includes five components: a multi junction solar chip 8, bypass diodes 10, a substrate insert 7, four conductor containing laminates 4 with a conductive layer 5, and a heat sink 1 configured to contain the laminates. The solar chip 8 in this embodiment is a III-V multi junction solar cell, but the structure is compatible with other planar chips with any semiconductor material that must be exposed to weather and a wide range of thermal expansion and contraction and which needs a heat sink.

Figure 5:
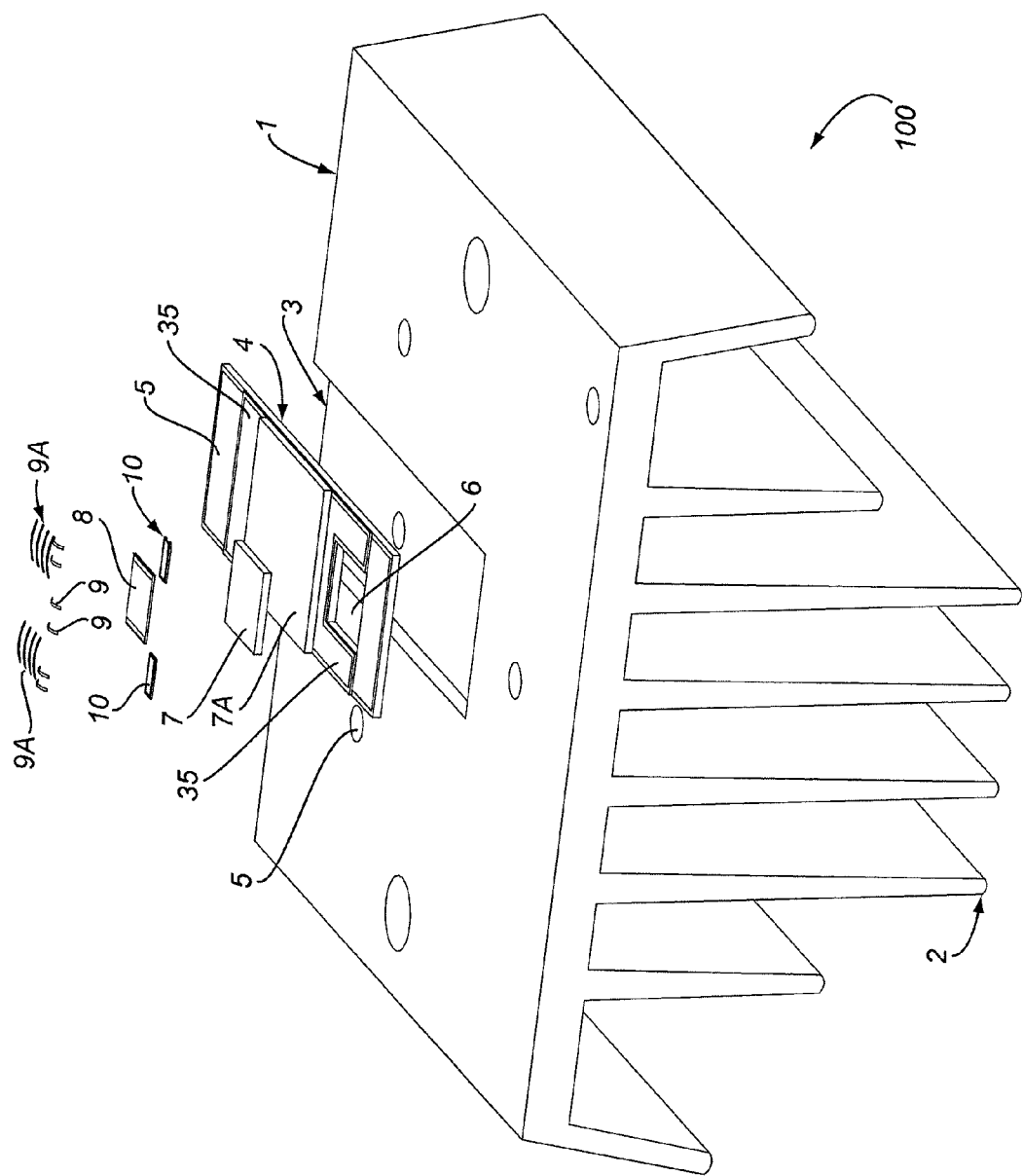
FIG. 5 is an assembly view of a solar package with a single multi-layered conductive laminate with a substrate insert.

Referring to FIGS. 2 and 5, the heat sink 1 is formed of a base that is preferably aluminum, but any metal or metallic alloy that is machinable or castable will work. The base in this embodiment is a modified flat top heat sink with cooling fins 2 of the sort commercially available (e.g., AAVID Thermalloy). Several cooling fins 2 protrude from the base of master heat sink 1 to allow thermal dissipation of heat conducted from solar radiation absorbed by the package.

Figure 3:
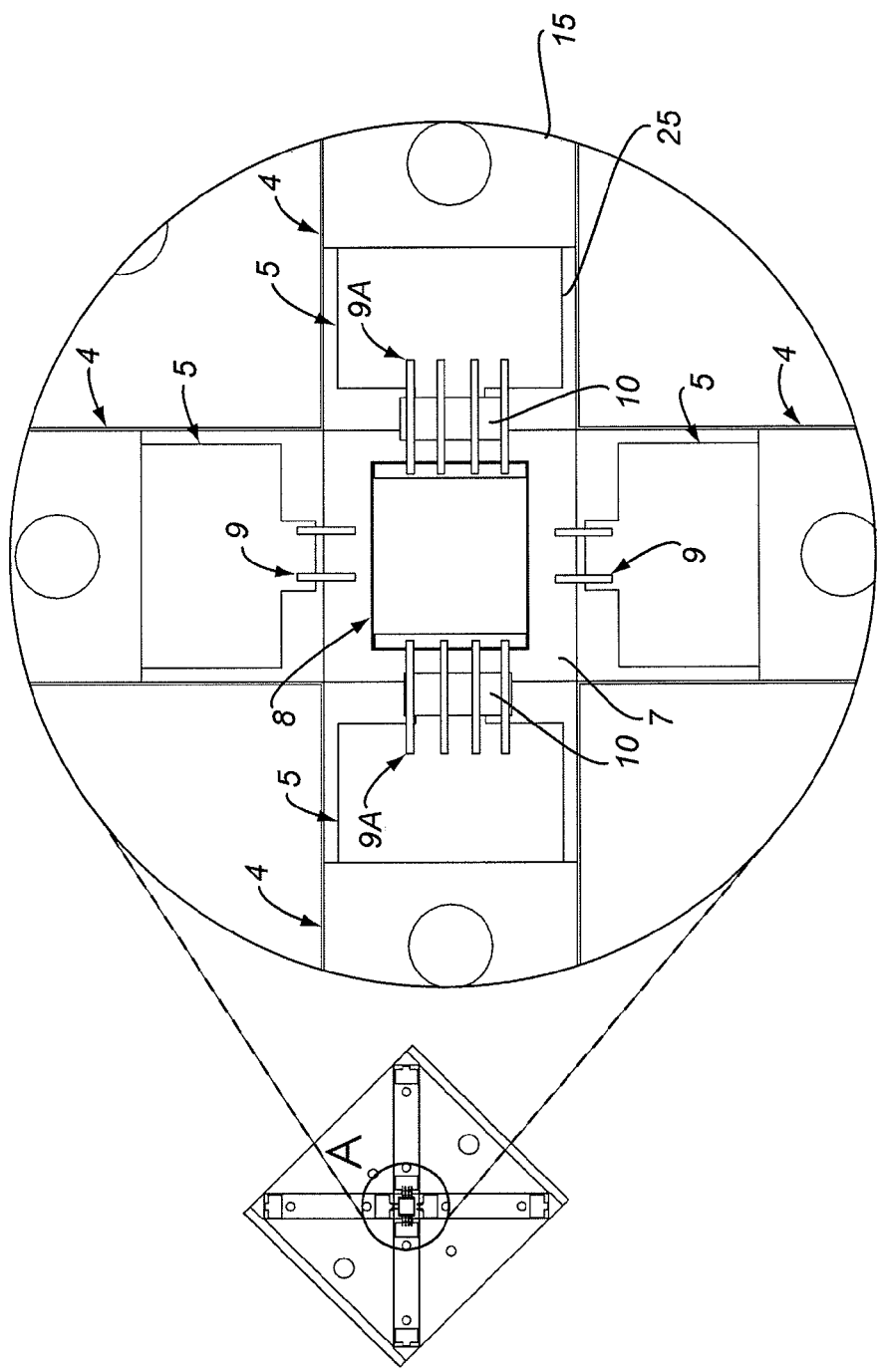
FIG. 3 is a plan view of the one substrate-insert embodiment of the invention showing the solar chip, the substrate insert, flip-chip bypass diodes, and their respective attachments to the conductive laminates.

The upper surface of the heat sink 1 of these embodiments is configured mechanically to have one or more channels 3 designed to seat conductive laminates 4 (FIG. 3). The channels 3 are formed so that when the conductive laminates 4 are seated within, the top surfaces of the laminates 4 are flush with or below the upper surface of the heat sink 1.

Each conductive laminate 4 is tripartite comprised of a metallic conductive layer with extended fingers 5 sandwiched between sheets of temperature-resistant PCB-type material 15, 25. One skilled in the art will understand that the board material can be any of a number of higher temperature PCB materials such as, but not limited to, materials from the G10-FR4 family, polyimides, Durastone®, or STABLCOR®. Other materials with comparable properties may also work. The metallic layer of the laminate is typically Au, Ag, Cu, or gold-plated copper, but one of skill in the art will recognize that other metals can serve as the conductive layer 5. The conductive layer 5 is fully encased within the non-conductive layers 15, 25 except for metal fingers exposed at both the proximal and distal ends of each laminate to serve as terminals for electrical connections.

Referring to FIG. 2, the electrically and thermally conductive laminates 4 are bonded to the channels 3 of the heat sink 1 such that the proximal ends of the four laminates 4 create a center cavity 6 larger than the solar chip 8. A square center cavity 6 is preferred, although other configurations are possible if desired. A variety of thermally-conducting, but electrically non-conductive adhesives or mechanical connections (including e.g., epoxy resins, eutectic compositions, solder, cyanoacrylates, mechanical fasters e.g., conductive, such as metal, or non-conductive, such as plastic, thermosonic bonding, or any combination of the above) may be used to affix the conductive laminates 4 to the channels 3. Electrically conductive fasteners (e.g., metal screws) may be used, although the fasteners must pass through non-conductive regions created within the conductive laminates during manufacturing. The distal end of each conductive laminate 4 preferably extends to the edge of the base where the exposed metallic finger of the conductor 5 provides a terminal available for electrical connections, although one skilled in the art will recognize that the conductive laminates can rest short of, or extend beyond, the edge of the base if desired. One of skill in the art will further understand that the metallic fingers of the conductor 5 attaching to the diodes can be a variety of shapes and sizes depending on the type of bypass diode (standard, flip-chip, or inverted flip-chip) to be used.

An unpatterned substrate insert 7 fits into the cavity 6 and is attached to the heat sink 1 with a thermal epoxy, solder, or eutectic material, thereby isolating the solar cell electrically from the heat sink 1. The substrate insert 7 in one embodiment shown (FIG. 2) is made of ALN metalized on both the upper and lower surfaces, although other metalized thermally-conductive materials are contemplated, including but not limited to BeO, graphite, SiC, ALSiC, and PCTF (with a base material of BeO or ALN). The substrate insert 7 may be the same height as the surrounding laminates 4, but is preferably lower than the walls of the cavity 6 formed by the laminates so as to minimize the vertical profile of the entire package to facilitate hermetic or anti-moisture sealing if desired. The substrate insert 7 is preferably larger in diameter than the solar cell 8.

Referring to FIG. 3, the solar cell 8 anode is bonded to the metalized upper surface of the substrate insert 7. Many types of thermal interface material (sometimes referred to as "mastic" or "TIM") may be used as a thermally conductive adhesive and to fill the gaps between the thermal transfer surface at the bottom of the solar cell chip and the upper surface of the substrate insert positioned in the heat sink. In a specific embodiment, Type EK 1000 or a similar mastic such as those manufactured by Dupont may be used, but those skilled in the art will recognize that many types of bonding materials could be used.

Cathode bus bars of the solar chip 8 are connected with wire or ribbon bonds 9 to proximal finger terminals 5 of opposing conductive laminates 4. The substrate insert 7 is wire- or ribbon-bonded with wire or ribbons 9A to the proximal conductive fingers 5 of the remaining two (perpendicular) laminates 4. Anode and cathode function may be reversed without departing from the scope of the invention.

Two bypass diodes 10 (standard configuration, inverted flip-chip, or preferably flip-chip) are connected to the solar chip 8. The electrical connection across the solar chip 8 for the bypass diodes 10 is achieved by bridging the cathode and anode segments using epoxy or any other joining materials appropriate for that purpose. The bypass diodes 10 bridge the proximal finger contacts 5 of the conductive laminates 4 and the surface of the substrate insert 7 (allowing excess bonding material to fall into the heat sink cavity during manufacture).

Figure 4:
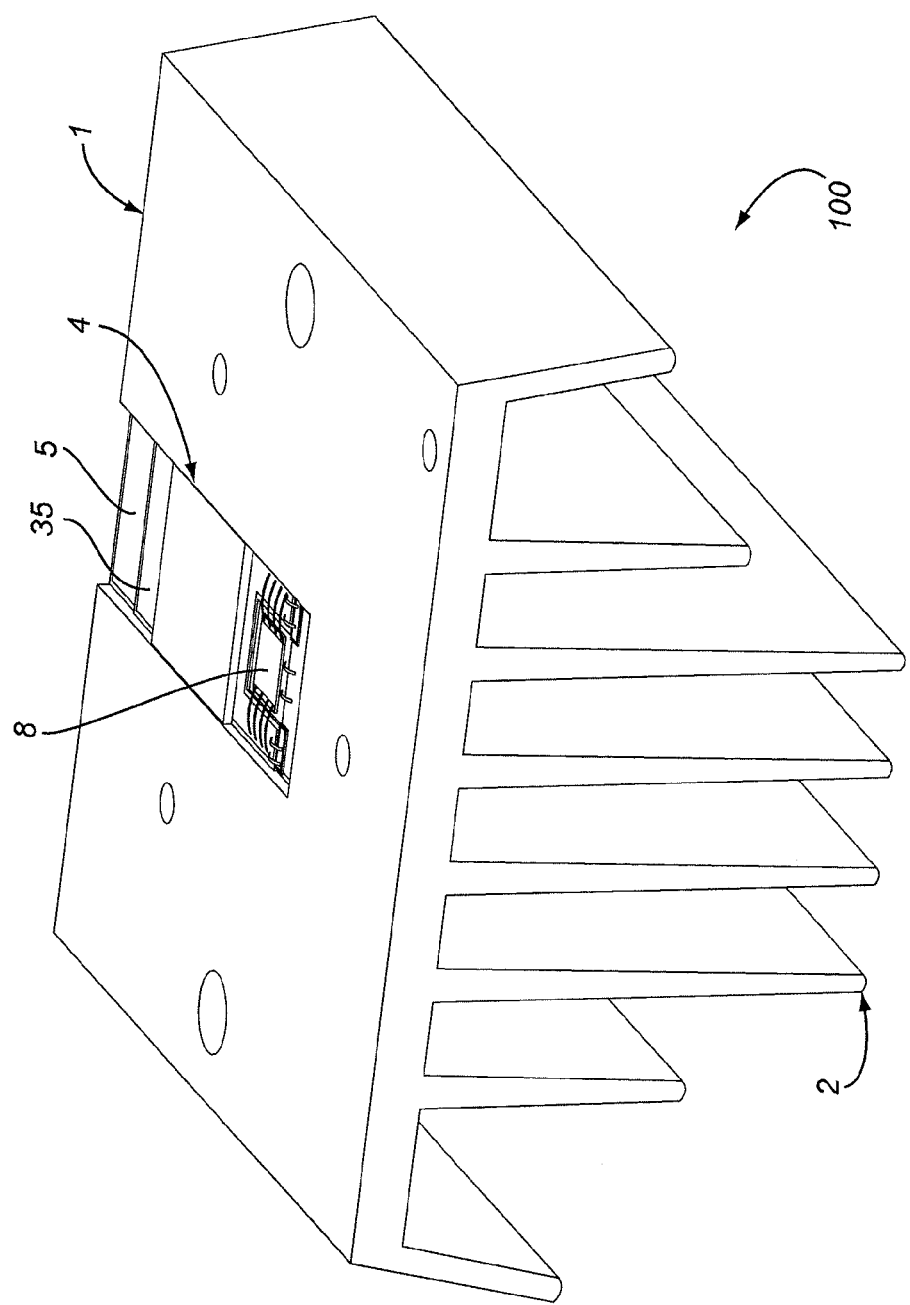
FIG. 4 is a plan view of a finished and packaged solar cell manufactured in accordance with a single multi-layered conductive laminate with substrate-insert embodiment of the invention.

In an alternate embodiment shown in FIGS. 4 and 5, conductive laminate 4 is modified to reduce the horizontal profile of the integrated package with a substrate insert 7. The solar chip 8 in this embodiment is a III-V multi junction solar cell, but the structure is compatible with other planar chips with any semiconductor material that must be exposed to weather and a wide range of thermal expansion and contraction.

Referring to FIGS. 4 and 5, heat sink 1 in this design has only one channel 3 designed to seat the laminate 4. Channel 3 extends from one distal edge of heat sink 1 towards the center to a chip location at a distance necessary so that when the chip Bis attached to the substrate insert 7, the center of the chip (in the x and y planes) lies as exactly as possible over the center (in the x and y planes) of the heat sink 1.

Figure 5A:
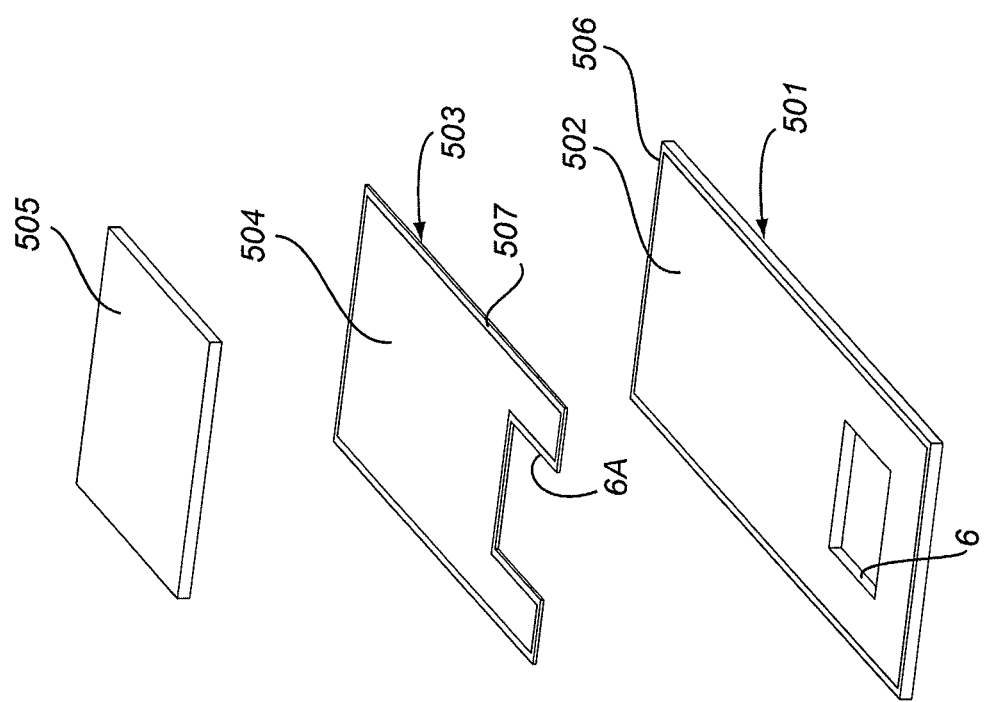
FIG. 5a is an assembly view of a five-layer conductive laminate.

In this embodiment, conductive laminate 4 functions as described above, but the laminar construction is modified. Referring to FIG. 5a, electrically and thermally conductive laminate 4 for this embodiment is a five-layer sandwich built, from the bottom up, with: (a) temperature-resistant PCB-type material 501; (b) a metallic conductive layer 502; (c) temperature-resistant PCB-type material 503; (d) a metallic conductive layer 504; and (e) temperature-resistant PCB-type material 505. One skilled in the art will understand that the board material for each layer can be any of a number of higher temperature materials such as, but not limited to, materials from the G10-FR4 family, polyimides, Durastone®, or STABLCOR®. The metallic layers 502, 504 of the laminate may be Au, Ag, Cu, or gold-plated Cu, but one of skill in the art will recognize that other metals can serve as the conductive layer.

Referring to FIGS. 5 and 5a, metallic bottom layer 502 is bonded to board bottom layer 501 such that a non-electrically conductive border 506 of the board material layer 502 extends beyond all sides of the metallic layer 502. Bottom layers 501 and 502 contain a cavity 6 near the proximal end of the laminate. Middle layers 503 and 504 each have a cutout 6A at its proximal end such that the cutout aligns to maintain cavity 6 when the bottom and middle layers are bonded together. Middle layers 503 and 504 are likewise bonded together such that a non-electrically conductive border 507 of the board material layer 503 extends beyond all sides of the metallic layer 504. When the conductive laminate 4 is assembled, the cutout 6A forms cavity 6 into which the substrate 7 insert fits. The lengthwise profile of middle layers 503 and 504 are shorter than the lengthwise profile of bottom layers 501 and 502 so as to expose metal fingers 5 on bottom layer 502 to serve as terminals for electrical connections. The lengthwise profile of top layer 505 is shorter than the lengthwise profile of middle layers 503 and 504 such that top layer 505 covers most of middle layer 504, leaving exposed metal fingers 35 from middle layer 504 to serve as terminals for electrical connections.

Bottom (501, 502), middle (503, 504), and top (505) layers are bonded together with a thermally-conductive, but non-electrically conductive adhesives (including, but not limited to epoxy resins, eutectic compositions, and cyanoacrylates) or thermosonic bonding. One of skill in the art will further understand that metallic fingers 35 can be a variety of shapes and sizes depending on what is needed for electrical connections or bypass diodes. A variety of thermally-conductive, but electrically non-conductive adhesives or mechanical connections (including e.g., epoxy resins, eutectic compositions, solder, cyanoacrylates, mechanical fasters (e.g., conductive, such as metal, or non-conductive, such as plastic), thermosonic bonding, or any combination of the above) may be used to affix the conductive laminate 4 to channel 3. Electrically conductive fasteners (e.g., metal screws) may be used, although the fasteners must pass through non-conductive regions created within the conductive laminates during manufacturing.

An unpatterned substrate insert 7 fits into the cavity 6, and is attached to heat sink 1 with a thermal epoxy, solder, or eutectic material, thereby isolating the solar cell electrically from the heat sink. The substrate insert is preferably comprised of ALN metalized on both the upper and lower surfaces, although other metalized thermally-conductive materials are contemplated, including but not limited to BeO, graphite, SiC, ALSiC, and PCTF (with a base material of BeO or ALN). Substrate insert 7 may be the same height as surrounding laminate 4, but is preferably lower than the walls of the cavity 6 formed by the laminates so as to minimize the vertical profile of the entire package to facilitate hermetic or anti-moisture sealing if desired. The substrate insert 7 is preferably larger in diameter than the solar cell.

Referring again to FIG. 4, the solar cell anode is bonded to the metalized upper surface of the substrate insert 7. Many types of thermal interface material (sometimes referred to as "mastic" or "TIM") may be used as a thermally conductive adhesive and to fill the gaps between the thermal transfer surface at the bottom of the solar cell chip and the upper surface of the substrate insert positioned in the heat sink. In a specific embodiment, Type EK 1000 or a similar mastic such as those manufactured by Dupont may be used, but those skilled in the art will recognize that many types of bonding materials could be used.

Referring again to FIGS. 4 and 5, the cathode bus bars on the upper surface of the solar chip 8 are connected with wire or ribbon bonds 9 to proximal conductive terminal fingers 15 of middle layer 504 of laminate 4. The substrate insert is wire- or ribbon-bonded to the proximal conductive finger terminal 5 of the bottom layer 502 of laminate 4.

Embedded Substrate Embodiments

Figure 6:
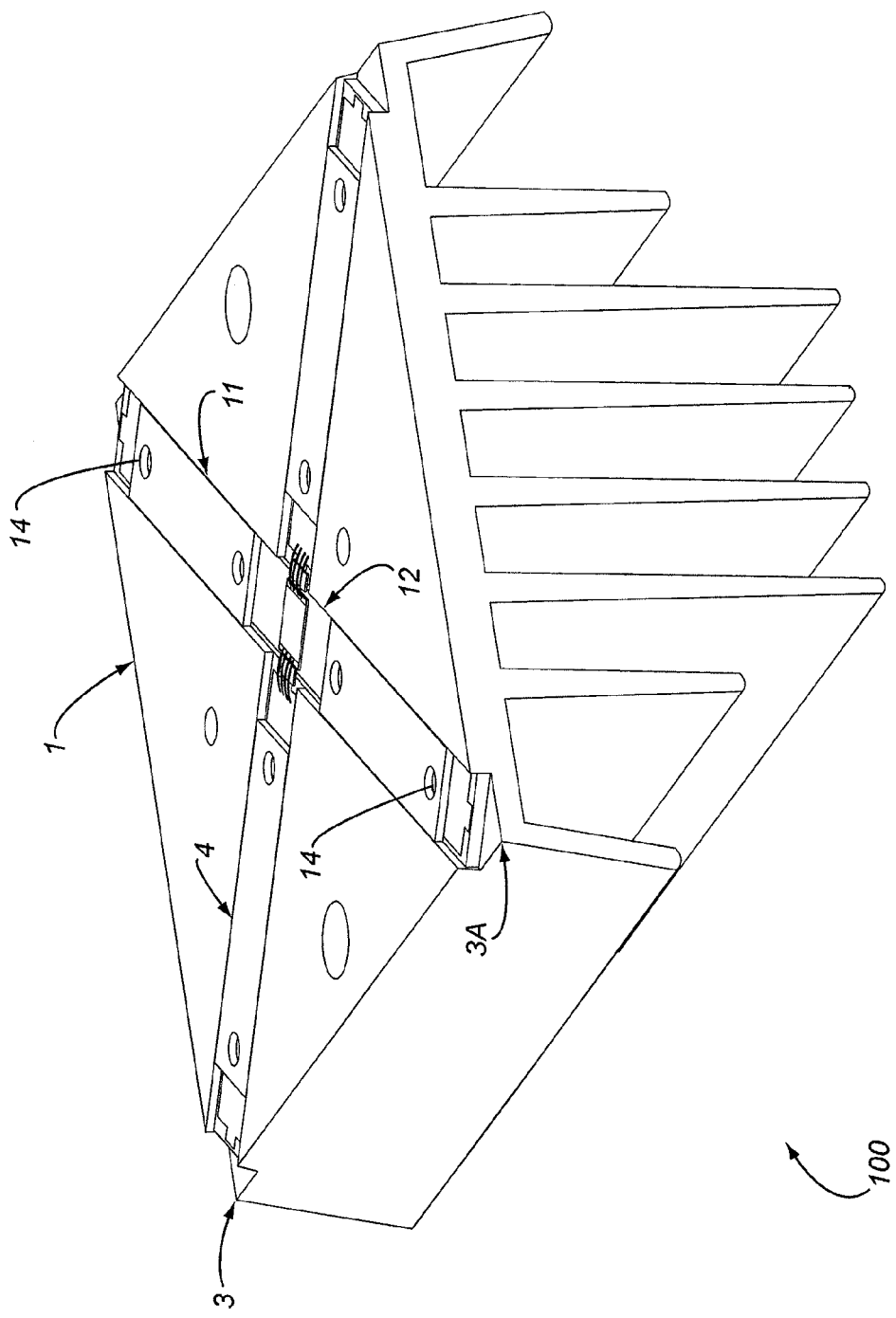
FIG. 6 is a plan view of a finished and packaged solar cell manufactured in accordance with an embedded-substrate embodiment of the invention.

Referring to FIG. 6, in this embodiment, a single extended substrate-embedded thermally and electrically conductive laminate 11 is attached within the channel 3 along one axis of the heat sink 1, while the channel 3A along the perpendicular axis contains the same conductive tripartite laminates 4 as described above (i.e., terminating proximally near the center of the heat sink). The substrate-embedded laminate 11 and the conductive laminates 4 may be affixed to the channels 3 of heat sink 1 with a variety of thermally-conductive but non-electrically conductive adhesives or mechanical connections (including e.g., epoxy resins, eutectic compositions, solder, cyanoacrylates, mechanical fasters (e.g., conductive, such as metal, or non-conductive, such as plastic), thermosonic bonding, or any combination of the above), although if electrically conductive fasteners (e.g., metal screws) are used, the fasteners must pass through non-conductive regions formed within the substrate-embedded and/or conductive laminates during manufacturing.

Figure 7:
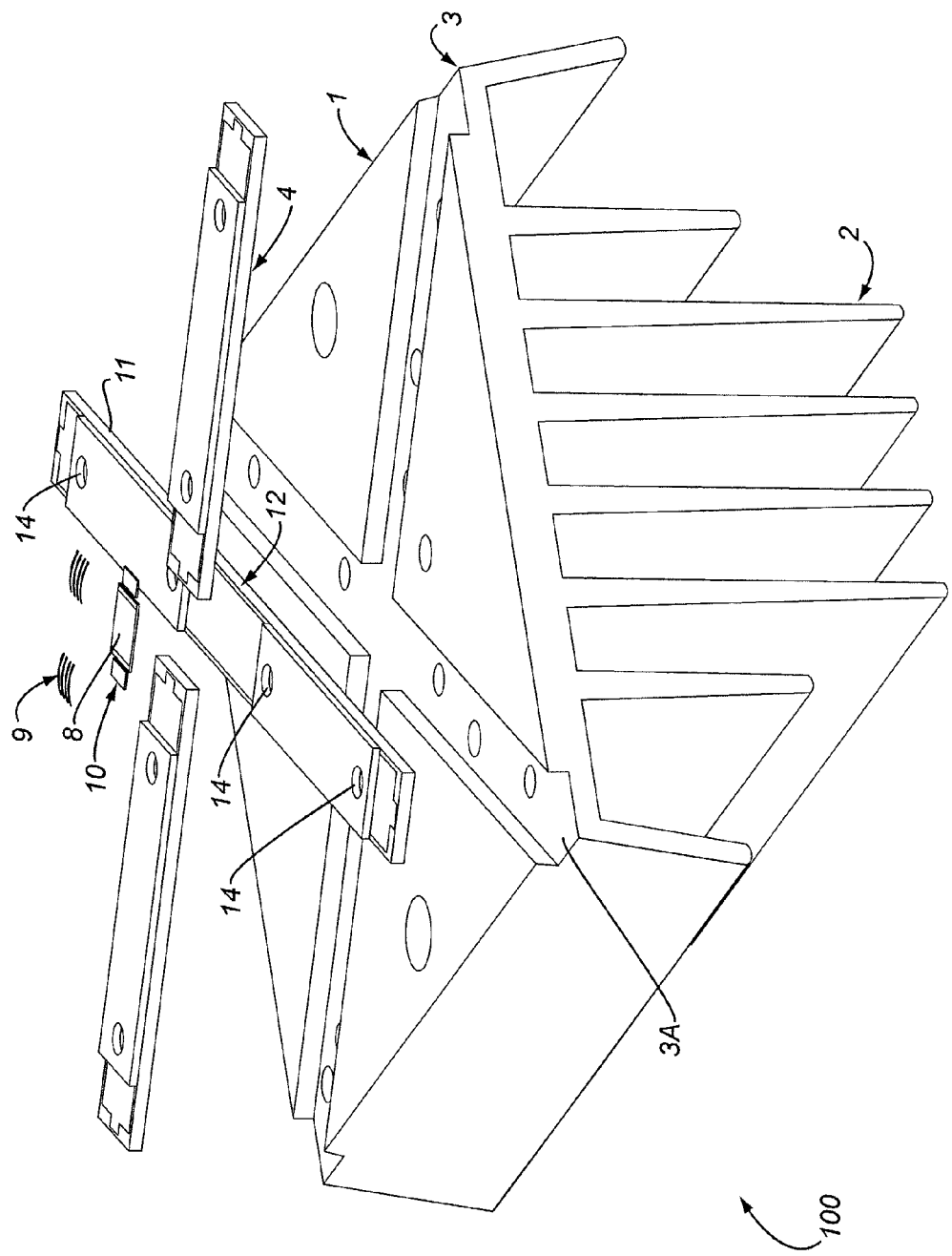
FIG. 7 is an assembly view showing an embedded-substrate embodiment with two short conductive laminates along one axis of the heat sink and a third longer conductive laminate with an embedded substrate along the perpendicular axis of the heat sink.

Referring to FIG. 7, the substrate-embedded laminate 11 in channel 3A is formed of a modified temperature-resistant PCB-type material with an embedded region 12 containing a thermally conductive material. One skilled in the art will recognize that the board material can be any of a number of higher temperature materials such as, but not limited to, materials from the FR4-G10 family, polyimides, Durastone®, or STABLCOR®. The board material is modified such that the embedded region 12 of the laminate is infiltrated with a thermally and electrically conductive substrate such as, but not limited to, metalized ALN, BeO, graphite, SiC, or ALSiC.

One method of infiltrating the thermally conductive substrate is to manufacture the center region of the laminate with multiple thermally and electrically conductive via holes (too small to be visible) passing from the upper surface of the laminate to the bottom surface. Each via hole is backfilled with a metal (e.g., AL, Cu, Ag, or Au), a composite, or a metal alloy. Alternatively, via holes are metalized along the entire extent of their inner surfaces and filled with a thermally conductive material, including but not limited to thermally conductive metals, ceramics, alloys, and composites. Alternatively, via holes are machined into the center region of the conductive laminate and then plugged with metallic or metalized ceramic studs. The via holes are both thermally and electrically conductive, allowing heat to be directed to the heat sink and current to be passed through the metallic layer of the laminate to the terminal fingers.

Via holes in the substrate-embedded embodiments are approximately 0.018 inches in diameter and typically occupy a minimum of 50% of the surface of the laminate center region. One of ordinary skill in the art, however, will recognize that the size and density of via holes can vary and will be determined by the percentage of radiant heat that can be diverted along each of the three possible planes (X, Y, and Z), as well as by process manufacturing concerns.

As shown in FIG. 7, the embedded region 12 in the substrate-embedded embodiments will extend laterally along the laminate beyond the edges of the intersecting conductive laminates. One skilled in the art will understand that the embedded region will extend laterally to a reasonable distance necessary to absorb stray light and redirect it to the heat sink.

Referring to FIGS. 6 and 7 together, the solar chip electrode bus bars are connected with wire- or ribbon-bonds 9 to the appropriate proximal conductive fingers of laminates 4. One or more flip-chip bypass diodes 10 are connected to the chip and are positioned preferably beneath the cathode wire or ribbon connections to minimize the package profile, although one of skill in the art will understand that the bypass diodes 10 can be positioned in other locations and inverted if desired. Alternatively, a standard bypass-diode can be seated on two opposing laminates 4 distal to the proximal conductive fingers 5 of the laminates 4.

The anode surface of the chip is bonded with a conductive (thermally and electrically) adhesive material (e.g., epoxy resins, eutectics, solder) to the embedded region 12 of the embedded laminate 11. Because electrically conductive via holes connect the surface of the embedded region 12 through the middle metallic layer of the embedded laminate, allowing electrical conduction to the finger terminals 5 of the embedded laminate 11, no explicit wire- or ribbon-bonding of the chip anode to the laminate 11 is necessary.

Figure 8:
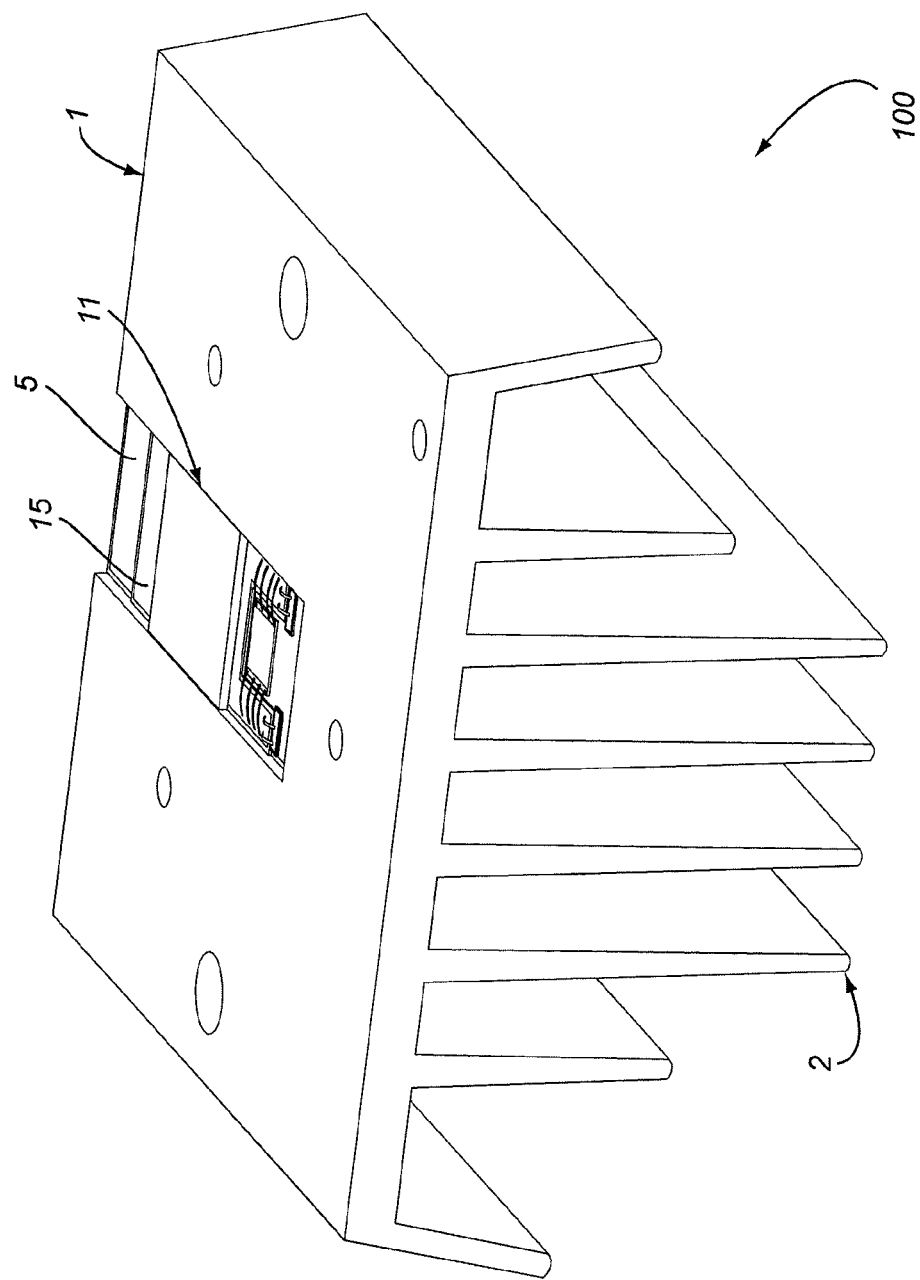
FIG. 8 is a plan view of a finished and packaged solar cell manufactured in accordance with a multi-layered, substrate-embedded laminate embodiment of the invention.

In an alternate embodiment shown in FIGS. 8 and 9, an integral heat sink is embedded within a modified conductive laminate 11, thereby reducing both the horizontal and vertical profile of the integrated package. The solar chip in this embodiment is a III-V solar cell, but the structure is compatible with other planar chips with any semiconductor material that must be exposed to weather and a wide range of thermal expansion and contraction.

Referring to FIGS. 8 and 9, heat sink 1 in this design has only one channel 3 designed to seat modified conductive laminate 11. Channel 3 extends from one distal edge of heat sink 1 towards the center a distance necessary so that when the chip 8 is inserted, the center of the chip (in the x and y planes) lies as exactly as possible over the center (in the x and y planes) of the heat sink.

Referring specifically to FIG. 8, a single modified substrate-embedded thermally and electrically conductive laminate 11 is attached within the channel 3. Substrate-embedded laminate 11 may be affixed to the channels 3 of heat sink 1 with a variety of thermally-conductive but non-electrically conductive adhesives or mechanical connections (including e.g., epoxy resins, eutectic compositions, solder, cyanoacrylates, mechanical fasters (e.g., conductive, such as metal, or non-conductive, such as plastic), thermosonic bonding, or any combination of the above), although if electrically conductive fasteners (e.g., metal screws) are used, the fasteners must pass through non-conductive regions created within the substrate-embedded and/or conductive laminates during manufacturing.

Modified substrate-embedded laminate 11 is a five-layer sandwich built as described above for the modified substrate-insert embodiment (FIG. 5a), with one exception. Instead of cavity 6 cut into the bottom layers 501 and 502 of the laminate for substrate insert 7, that region of laminate 11 comprises an embedded region 12 (FIG. 9) containing a thermally conductive material. One skilled in the art will recognize that the board material can be any of a number of higher temperature PCB materials such as, but not limited to, materials from the FR4-G10 family, polyimides, Durastone®, or STABL-COR®. The board material is modified such that the embedded region 12 of the laminate is infiltrated with a thermally and electrically conductive substrate such as, but not limited to, metalized ALN, BeO, graphite, SiC, or ALSiC.

One method of infiltrating the thermally conductive substrate is to manufacture the embedded region 12 of the laminate 11 with multiple via holes (too small to be visible) passing from the upper surface of the laminate 11 to the bottom surface. Each via hole is backfilled with a metal (e.g., AL, Cu, Ag, or Au), a composite, or a metal alloy. Alternatively, via holes are metalized along the entire extent of their inner surfaces and filled with a thermally conductive material, including but not limited to thermally conductive metals, ceramics, alloys, and composites. Alternatively, via holes are machined into the embedded region of the conductive laminate and then plugged with metallic or metalized ceramic studs. The via holes are both thermally and electrically conductive, allowing heat to be directed to the heat sink 1 and electrical current to be passed through the metallic layer 5 of the laminate 11 to the terminal fingers.

Via holes in the substrate-embedded embodiments are preferably 0.018 inches in diameter, and typically occupy a minimum of 50% of the surface of the laminate embedded region. One of ordinary skill in the art, however, will recognize that the size and density of via holes can vary and will be determined by the percentage of radiant heat that can be diverted along each of the three possible planes (X, Y, and Z), as well as by process manufacturing concerns.

As shown in FIG. 9, the embedded region 12 in this embodiment preferably extends laterally along the laminate only to the proximal edges of middle layers. One skilled in the art will recognize that the embedded region can be extended further laterally if desired.

Referring again to FIGS. 8 and 9, the solar chip electrode bus bars are connected with wire- or ribbon-bonds 9 to proximal conductive fingers 45 of middle layer of laminate 11. One or more flip-chip bypass diodes may be connected to the chip and are positioned, preferably on proximal terminal finger 5 adjacent to the proximal end of middle layers of laminate 11 to minimize the package profile, although one of skill in the art will understand that the flip-chip bypass diodes can be positioned in other locations or inverted if desired. Alternatively, a standard bypass-diode can be used.

The anode surface of the chip is bonded with a conductive (thermally and electrically) adhesive material (e.g., epoxy resins, eutectics, solder) to the embedded region 12 of the substrate-embedded laminate 11. Because electrically conductive via holes connect the surface of the embedded region 12 through the lower metallic layer of the embedded laminate, allowing conduction to finger terminals of the embedded laminate 11, no explicit wire- or ribbon-bonding of the chip anode to the laminate 11 is necessary.

The foregoing describes an assembly and various embodiments that can be automatically constructed.

The integrated solar cell package can be sealed hermetically or against moisture using a variety of substances and methods, as, for example, by applying a proprietary hermetic conformal coating material (not shown for clarity of other elements) that permanently seals the covered surfaces from the environment. Although conformal coatings have been available for many years, they have not generally been sufficiently impermeable to moisture to create true hermetic sealing required by the standards in use today. See, e.g., Mil Spec 883. As disclosed in U.S. Patent Publication No. US 2009/068474, hereby incorporated by reference in its entirety, the conformal coating used in this invention may be an alkali silicate compound called Alkali Silicate Glass obtained from Rockwell Collins. The material is disclosed in at least the following patent application: U.S. 2009/0068474 A1. It is believed that the technology is subject of other patent applications from the same source. Once all of the solar package components are in place, the conformal coating is spray-applied at room temperature to encapsulate the semiconductor and associated electrical connectors and connections (e.g., wire bonds and bypass diodes), and then cured at an elevated temperature. The thickness of the conformal coating will be determined by the manufacturer's specification and may vary from one application to another from a minimum of 40 nm upwards, depending on the lifespan and durability of the coating desired.

While the foregoing written description of the invention will enable one skilled in the art to make and use the invention, those skilled will understand and appreciate the number of variations, combinations, and equivalents of the specific embodiment, method, and examples herein. The invention should therefore not be limited by the above describes embodiments, methods, and examples. Other embodiments will be evident to those of ordinary skill in the art. Therefore it is not intended that this invention be limited, except as indicated by the appended claims.

What is claimed is:

1. A solar cell device comprising:
   a heat sink having an upper surface, said upper surface having a recessed channel connecting a recessed central region of said upper surface with an edge of said upper surface;
   a laminate disposed in said recessed channel, wherein said laminate comprises:
     a proximal end disposed toward the central region of the heatsink and a distal end disposed toward the edge;
     the proximal end of the laminate defining a center cavity therethrough;
     at least one electrically conductive layer; and
     at least one electrically non-conductive layer comprising a non-ceramic printed circuit board material;
   a thermally conductive insert disposed within and through the center cavity of the laminate, wherein,
     the thermally conductive insert comprises a thermally-conductive material metalized on an upper surface and on a lower surface; and
     the lower surface is bonded to the recessed central region of the heatsink; and
   a solar cell, wherein the solar cell is bonded to the upper surface of the thermally conductive insert and the solar cell is electrically connected to the at least one electrically conductive layer;
   wherein the solar cell and an upper surface of the laminate is lower than the upper surface of the heat sink.

2. The device of claim 1, wherein the at least one electrically non-conductive layer of said laminate comprises temperature resistant printed circuit board material.

3. The device of claim 1 wherein the at least one electrically non-conductive layer comprises a material selected from the group consisting of aluminum nitride, beryllium oxide, graphite, silicon carbide and aluminum silicon carbide.

4. The device of claim 1 wherein the solar cell is hermetically sealed.

5. The device of claim 1, comprising one or more bypass diodes, wherein the one or more bypass diodes are electrically connected to said solar cell and to said electrically conductive layer.

6. The device of claim 1, wherein the laminate comprises a metallic conductive layer comprising extended fingers sandwiched between sheets of temperature resistant printed circuit board material.

7. The device of claim 1, wherein the laminate comprises a tripartite laminate.

8. The device of claim 1, wherein the non-ceramic printed circuit board material is selected from a glass-reinforced epoxy, polyimide, carbon composite, and fiber-reinforced epoxy resin.

9. The device of claim 1, wherein the laminate comprises a five-layer sandwich.

10. The device of claim 1, wherein each of the metallized upper surface and the metallized lower surface is unpatterned.

11. The device of claim 1, wherein the solar cell comprises an anode is bonded to the metallized upper surface of the insert.

12. The device of claim 1, wherein the solar cell is electrically connected to proximal finger terminals with wire or ribbon bonds.

13. The device of claim 1, wherein the insert is electrically connected to proximal finger terminals with wire or ribbon bonds.

14. A solar cell device comprising:
   a heat sink comprising an upper surface, a central region, and a plurality of recessed channels extended from the central region to respective corners of the upper surface of the heat sink;
   a thermally and electrically conductive laminate disposed within each of the plurality of recessed channels; wherein
     each of the thermally and electrically conductive laminates comprises at least one electrically conductive layer, at least one electrically non-conductive layer, and an electrical interconnection terminal; and
   the thermally and electrically conductive laminates define a cavity therethrough located at the central region of the heat sink;
   a thermally conductive insert disposed within and through the cavity; wherein the thermally conductive insert comprises a metallized top surface and a metallized bottom surface; and
     the metallized bottom surface is bonded to the heat sink and a solar cell, wherein the solar cell is bonded to the metallized top surface of the thermally conductive insert, and the solar cell is bonded to at least one of the electrical interconnection terminals.

15. The device of claim 14, comprising one or more bypass diodes disposed within the cavity and electrically connected to the solar cell.

16. The device of claim 14, wherein the thermally conductive insert comprises a material selected from aluminum nitride, beryllium oxide, graphite, silicon carbide, and aluminum silicon carbide.

17. The device of claim 14, wherein the at least one electrically non-conductive layer of said laminate comprises a temperature resistant printed circuit board material.

18. The device of claim 14, wherein the solar cell is hermetically sealed.

* * * * *